United States Patent
Park et al.

(10) Patent No.: US 9,728,269 B2
(45) Date of Patent: Aug. 8, 2017

(54) SEMICONDUCTOR MEMORY DEVICE FOR PERFORMING REPAIR OPERATIONS BASED ON REPAIR INFORMATION STORED THEREIN

(71) Applicant: SK hynix Inc., Gyeonggi-do (KR)

(72) Inventors: Ga-Ram Park, Gyeonggi-do (KR); Jun-Cheol Park, Gyeonggi-do (KR)

(73) Assignee: SK Hynik Inc., Gyeonggi-do (KR)

( * ) Notice: Subject to any disclaimer, the term of this patent is extended or adjusted under 35 U.S.C. 154(b) by 0 days.

(21) Appl. No.: 15/048,486

(22) Filed: Feb. 19, 2016

(65) Prior Publication Data

US 2017/0117057 A1    Apr. 27, 2017

(30) Foreign Application Priority Data

Oct. 22, 2015    (KR) .................. 10-2015-0147301

(51) Int. Cl.
  G11C 17/00    (2006.01)
  G11C 17/16    (2006.01)
  G11C 29/00    (2006.01)
  G11C 17/18    (2006.01)

(52) U.S. Cl.
  CPC ............ G11C 17/16 (2013.01); G11C 29/783 (2013.01); *G11C 17/18* (2013.01)

(58) Field of Classification Search
  CPC ...... G11C 17/16; G11C 17/18; H01L 23/5252
  USPC .......................................... 365/96, 201, 200
  See application file for complete search history.

(56) References Cited

U.S. PATENT DOCUMENTS

| 9,311,984 | B1* | 4/2016 | Hong | ................... G11C 11/406 |
| 2004/0218431 | A1* | 11/2004 | Chung | ................ G11C 29/783 |
| | | | | 365/200 |
| 2016/0247553 | A1* | 8/2016 | Lee | ........................ G11C 17/16 |
| 2016/0293278 | A1* | 10/2016 | Kim | ..................... G11C 29/783 |

FOREIGN PATENT DOCUMENTS

| KR | 1020140039602 | 4/2014 |
| KR | 1020140071811 | 6/2014 |
| KR | 1020170034176 | 3/2017 |

* cited by examiner

*Primary Examiner* — Connie Yoha
(74) *Attorney, Agent, or Firm* — IP & T Group LLP

(57) ABSTRACT

A semiconductor memory device includes a memory array region including normal cells and redundancy cells; a repair fuse block including a plurality of fuse sets suitable for programming repair addresses of the repair target cells as repair information, the repair fuse block being suitable for outputting the programmed repair information, in response to a boot-up signal; a fuse information storage block including a plurality of memory cells for storing the repair information outputted from the repair fuse block, the plurality of memory cells being refreshed simultaneously with the normal cells and the redundancy cells of the memory array region; and a repair control block suitable for comparing the repair information stored in the fuse information storage block and an address to generate a repair control signal to selectively activate redundant paths between the repair target cells and the redundancy cells.

19 Claims, 7 Drawing Sheets

SEMICONDUCTOR MEMORY DEVICE FOR PERFORMING REPAIR OPERATIONS BASED ON REPAIR INFORMATION STORED THEREIN

CROSS-REFERENCE TO RELATED APPLICATION

This application claims priority under 35 U.S.C. §119 to Korean Patent Application No. 10-2015-0147301 filed on Oct. 22, 2015 in the Korean Intellectual Property Office, the disclosure of which is incorporated herein by reference in its entirety.

TECHNICAL FIELD

Exemplary embodiments relate to a semiconductor design technology and, more particularly, to a semiconductor memory device suitable for performing a repair operation.

DISCUSSION OF THE RELATED ART

In general, semiconductor memory devices, such as a double data rate synchronous DRAM (DDR SDRAM), include a plurality of memory cells. As manufacturing technologies continue to improve, the degree of integration and thus the number of memory cells included in a semiconductor memory device also continues to gradually increase. If a fail occurs in even one of the memory cells of a semiconductor memory device, the semiconductor device may malfunction. Therefore, often a semiconductor memory device including a failed memory cell cannot properly perform a required operation, and it may be discarded.

Generally, it is inefficient to discard a semiconductor memory device as a bad product due to a small number of failed memory cells. Thus, in order to improve the manufacturing yield, redundancy memory cells are often included in a semiconductor memory device in addition to normal memory cells.

A redundancy control circuit may detect, in advance, the occurrence of a fail through a test and substitute a memory cell where the fail has occurred with a redundancy memory cell, when access to the corresponding memory cell is requested. The redundancy memory cells are separately prepared in addition to normal memory cells and are used as replacement memory cells for failed memory cells.

That is, when a fail occurs in a normal memory cell, a redundancy memory cell replaces the failed memory cell. A failed memory cell is also referred to hereinafter as a "repair target memory cell."

More specifically, for example, in read and write operations, when access requested to a repair target memory cell, instead of the repair target memory cell a redundancy memory cell is accessed internally.

Accordingly, when an address corresponding to a repair target memory cell is received, a semiconductor memory device may perform an operation for accessing a redundancy cell instead of the repair target memory cell. Hereinafter, such operation may be referred as a "repair operation". Through such a repair operation, proper operation of the semiconductor memory may be ensured. In order to perform a repair operation, a semiconductor memory device needs not only redundancy memory cells but also other circuits, such as a repair fuse circuit for storing repair information of a row address or a column address, and a fuse information storage circuit for storing information of repair fuses. The repair fuse circuit typically stores an address corresponding to a repair target memory cell (hereinafter, referred to as a "repair target address"). Fuses included in the repair fuse circuit are programmed with the repair target address. The semiconductor memory device may perform the repair operation by using the programmed repair target address.

As the capacity of a semiconductor memory device increases, a greater number of repair fuse circuits and fuse information storage circuits are required. In particular, in order to ensure reliability of a unit fuse set latch disposed in a fuse information storage circuit, a dice cell structure is adopted, and thus a circuit area occupied by the unit fuse set latch increases.

SUMMARY

Various embodiments are directed to a semiconductor memory device capable of decreasing the circuit area used for a repair operation.

Also, various embodiments are directed to a semiconductor memory device capable of ensuring the reliability of repair information used for a repair operation, through a minimal modification in circuit configurations.

In an embodiment, a semiconductor memory device may include: a memory array region including normal cells and redundancy cells; a repair fuse block including a plurality of fuse sets suitable for programming repair addresses of the repair target cells as repair information, the repair fuse block being suitable for outputting the programmed repair information, in response to a boot-up signal; a fuse information storage block including a plurality of memory cells for storing the repair information outputted from the repair fuse block, the plurality of memory cells being refreshed simultaneously with the normal cells and the redundancy cells of the memory array region; and a repair control block suitable for comparing the repair information stored in the fuse information storage block and an address to generate a repair control signal to selectively activate redundant paths between the repair target cells and the redundancy cells.

In an embodiment, a semiconductor memory device may include: a memory array region including normal cells and redundancy cells; a repair fuse block including a plurality of fuse sets suitable for programming repair addresses of the repair target cells as repair information, the repair fuse block being suitable for outputting the repair information programmed in the plurality of fuse sets, in response to a boot-up signal; an operation control block suitable for selectively outputting one among a refresh address generated by counting a refresh signal, a row address and a boot-up address generated by performing a counting operation based on the boot-up signal, as a target row address; a fuse information storage block suitable for storing the repair information outputted from the repair fuse block and outputting the stored repair information, in response to a word line active command, the boot-up signal and the target row address, and including a plurality of memory cells which are refreshed; a repair control block suitable for comparing the repair information stored in the fuse information storage block and the target row address to generate a repair control signal to selectively activate redundant paths between the repair target cells and the redundancy cells; a row circuit suitable for activating a word line selected by the target row address, and selectively activating the redundant paths in response to the repair control signal; and a column circuit suitable for accessing data of a bit line selected by a column address in a read or write operation.

DETAILED DESCRIPTION

Figure 1:
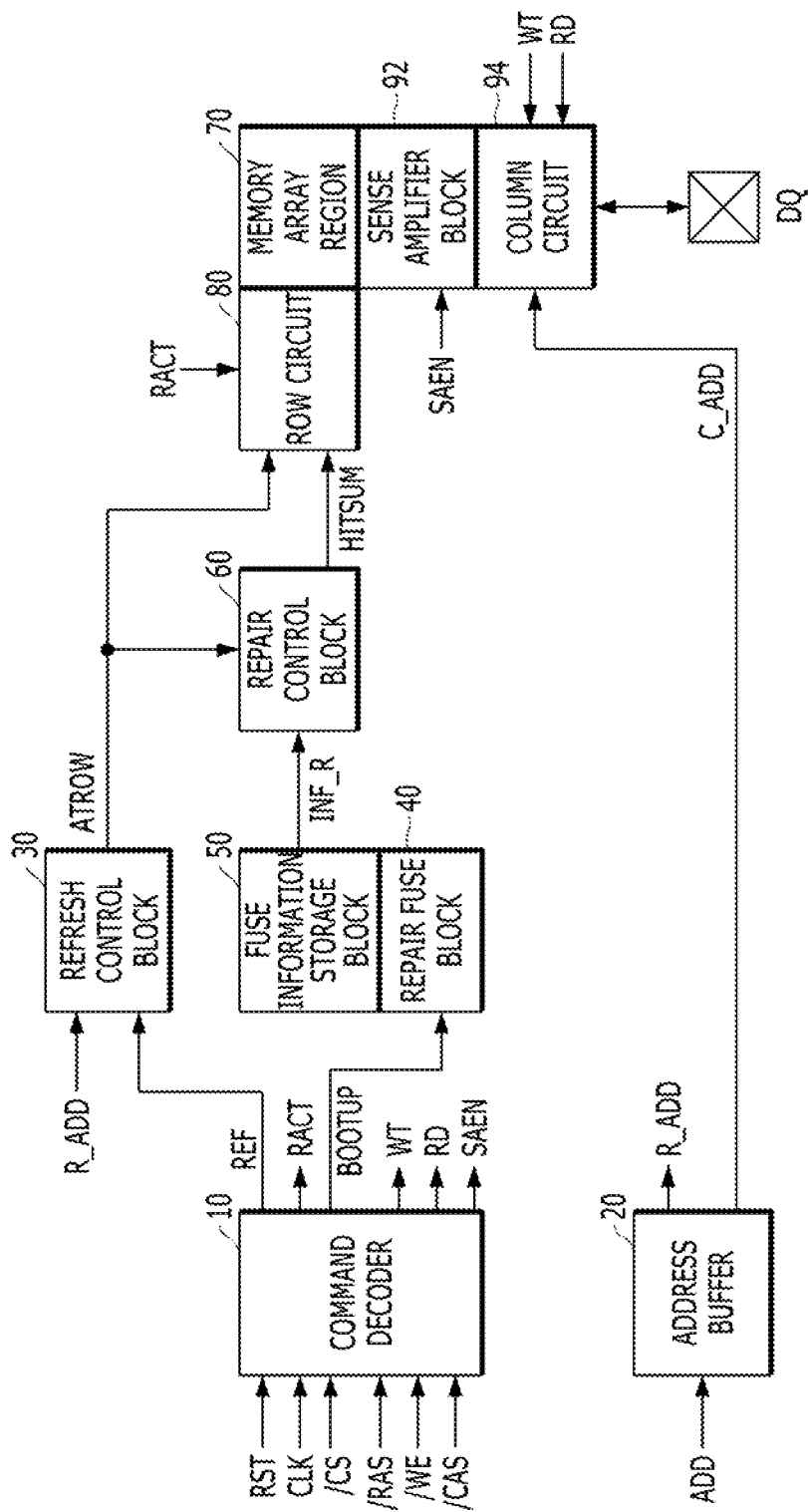
FIG. 1 is a diagram illustrating a semiconductor memory device.

Various embodiments will be described below in more detail with reference to the accompanying drawings. The present invention may, however be embodied in different forms and should not be construed as limited to the embodiments set forth herein. Rather, these embodiments are provided so that this disclosure will be thorough and complete, and will fully the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. A volatile memory device, for example, a DRAM, will be described as a semiconductor memory device. Also, it is to be noted that a configuration corresponding to one memory bank in a semiconductor memory device is illustrated. However, it is noted that the invention is not limited in this way.

FIG. 1 is a block diagram illustrating a repair operation of a semiconductor memory device.

Referring to FIG. 1, the semiconductor memory device includes a command decoder 10, an address buffer 20, a refresh control block 30, a repair fuse block 40, a fuse information storage block 50, a repair control block 60, a memory array region 70, a row circuit 80 a sense amplifier block 92, and a column circuit 94.

The command decoder 10 may decode command signals RST, /CS, /RAS, /CAS and /WE inputted from an external device, in synchronization with a clock signal CLK, to generate a refresh signal REF, a sense amplifier control signal SAEN, a word line active command RACT, a boot-up signal BOOTUP, a write command WT, and a read command RD.

The address buffer 20 may buffer an external address ADD may output a row address R_ADD and a column address C_ADD.

The refresh control block 30 may select a refresh address REF_ADD, generated by counting the refresh signal REF, or the row address R_ADD, and may output the selected address as a target row address ATROW. In a refresh operation, the refresh control block 30 may output the refresh address REF_ADD as the target row address ATROW, and the row circuit 80 may receive the target row address ATROW in response to the word line active command RACT and sequentially access all word lines in the memory array region 70 to perform the refresh operation.

The repair fuse block 40 may include a plurality of fuses (not shown) for programming an address corresponding to a repair target word line, hereinafter referred to as a repair target address. The repair fuse block 40 may output the programmed repair target address to the fuse information storage block 50 in response to the boot-up signal BOOTUP. The fuse information storage block 50 may store the repair target address provided from the repair fuse block 40, as repair information INF_R, and may output the repair information INF_R to the repair control block 60.

The repair control block 60 may compare the repair information INF_R received from the fuse information storage block 50 with the target row address ATROW received from the refresh control block 30. If the repair information INF_R and the target row address ATROW are found to correspond to each other, the repair control block 60 may output and activate a repair control signal HITSUM.

The memory array region 70 may include a normal cell region (not shown) and a redundancy cell region (not shown). If a failed memory cell, that is, a repair target memory cell is found in the normal cell region, a normal word line on which the repair target memory cell is positioned may be replaced with a redundancy word line of the redundancy cell region.

The row circuit 80 may activate a word line selected by the target row address ATROW in response to the word line active command RACT and may activate a redundancy word line instead of the word line designated by the target row address ATROW when the repair control signal HITSUM is activated. Hence, the repair target word line corresponding to the repair information INF_R stored in the fuse information storage block 50 may be replaced with the redundancy word line.

The sense amplifier block 92 may perform an operation of sensing and amplifying data of a memory cell transmitted through a bit line from the memory array region 70, in response to the sense amplifier control signal SAEN.

The column circuit 94 may access data of a bit line selected by the column address C_ADD. For example, in a read operation, the column circuit 94 may output data received from a bit line selected by the column address C_ADD, to a DQ pad, in response to the read command RD. Also, in a write operation, the column circuit 94 may transfer data received through a DQ pad, to a bit line corresponding to the column address C_ADD, and thereby may store the data, in response to the write command T.

Meanwhile, in a conventional semiconductor memory device, the repair information INF_R corresponding to the repair target address may be programmed in the repair fuse block 40, and the repair information INF_R may be stored in the fuse information storage block 50 in response to the boot-up signal BOOTUP. For reference, the reason why the repair information INF_R is stored in the repair fuse block 40 is not immediately used and is used by being transferred to and stored in the fuse information storage block 50 is as follows. Since the repair fuse block 40 is configured in an array type, a certain time may be required to access data stored therein. Because immediate access to data may be impossible, the repair information may not be performed immediately by using the data stored in the repair fuse block 40. Therefore, a boot-up operation, in which the repair information stored in the repair fuse block 40 may be transmitted to and stored in the fuse information storage block 50, may be performed, and the repair operation may be performed using the data stored in the fuse information storage block 50 after the boot-up operation is performed.

Meanwhile, as the capacity of a semiconductor memory device increases, the number of repair fuse blocks 40 and fuse information storage blocks 50 for storing repair information of row or column addresses also increases. Moreover, as a dice cell structure may be adopted to ensure reliability, a circuit area that is occupied by a unit fuse set latch disposed in the fuse information storage circuit 50, in an entire semiconductor memory device, may increase as well.

As will be described below, in an embodiment of the present invention a semiconductor device is provided, which includes a fuse information storage block having the same structure as the cell structure of a memory array. Accordingly, a circuit area for the fuse information storage block may be reduced. Also, since cell capacitors in a memory array and cell capacitors of the fuse information storage block may be refreshed simultaneously in refresh operation, it is possible to ensure a more reliable repair information.

Figure 2:
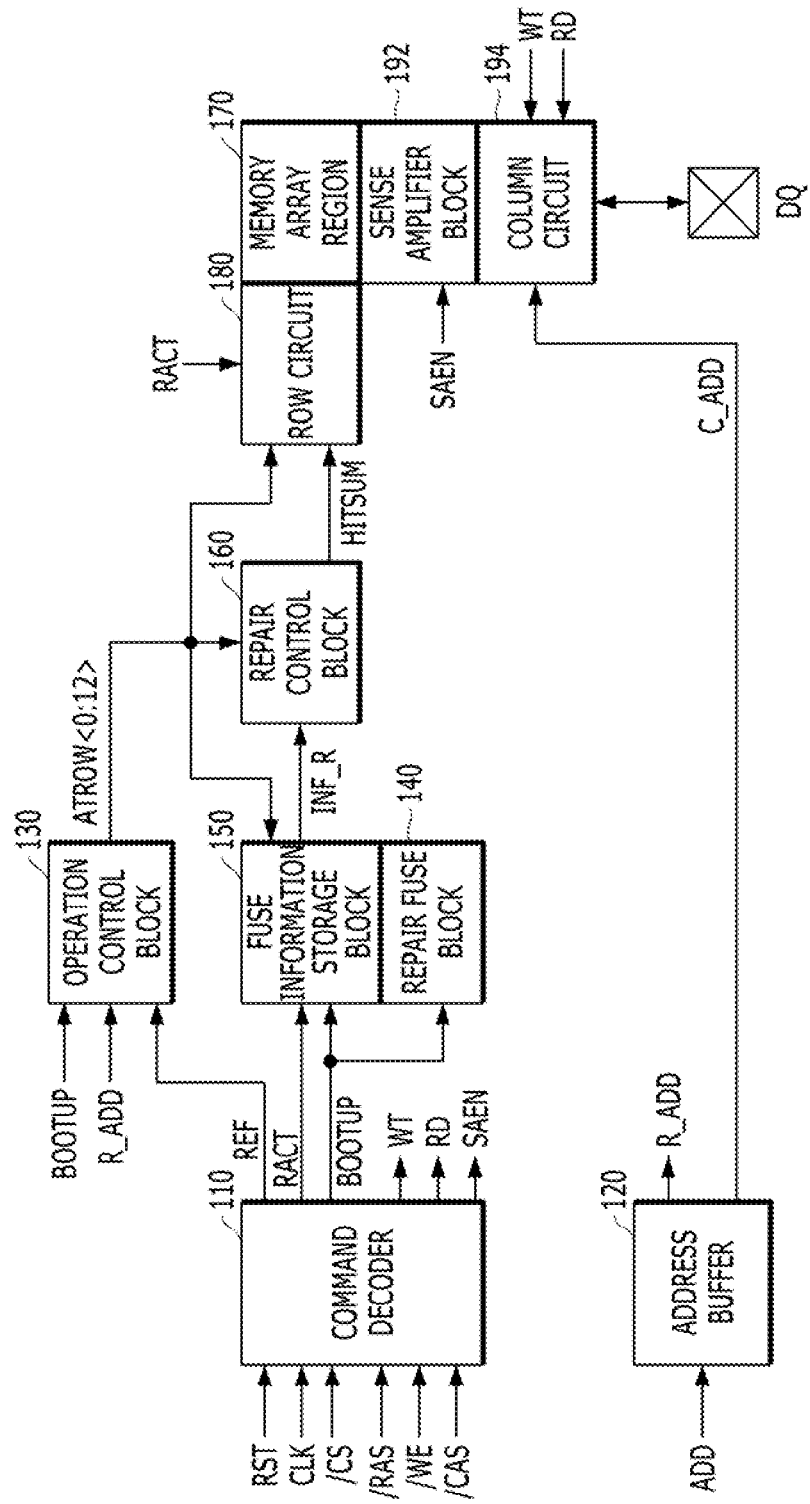
FIG. 2 is a diagram illustrating a semiconductor memory device, according to an embodiment of the present invention.

FIG. 2 is a block diagram illustrating a semiconductor memory device, in accordance with an embodiment of the present invention.

Referring to FIG. 2, the semiconductor memory device may include a command decoder 110, an address buffer 120, an operation control block 130, a repair fuse block 140, a fuse information storage block 150, a repair control block 160, a memory array region 170, a row circuit 180, a sense amplifier block 192, and a column circuit 194.

The command decoder 110 may decode signals RST, /CS, /RAS, /CAS and /WE received from an external device in response to a clock signal CLK, and may generate a refresh signal REF, a sense amplifier control signal SAEN, a word line active command RACT, a boot-up signal BOOTUP, a write command WT, and a read command RD. For reference, RST is a reset signal, /CS is a chip select signal, /RAS is a row address strobe signal, /CAS is a column address strobe signal and /WE is a write enable signal. For reference, the word line active command RACT is activated in response to an active command (ACT, not shown) to activate a word line in the memory array region 170, and deactivated in response to a precharge command (PCG, not shown) to deactivate a word line.

The address buffer 120 may buffer an external address ADD may output a row address R_ADD and a column address C_ADD.

The operation control block 130 may receive the boot-up signal BOOTUP, the refresh signal REF and the row address R_ADD. The operation control block 130 may generate a target row address ATROW<0:12>. The operation control block 130 may generate the target row address ATROW<0:12> by counting the refresh signal REF in a refresh mode, generate the target row address ATROW<0:12> by using the row address R_ADD in a normal mode for performing read and write operations, and generate the target row address ATROW<0:12> based on the boot-up signal BOOTUP in a boot-up mode.

The memory array region 170 may include normal cells and redundancy cells to replace repair target cells among the normal cells. If repair target cells are found, normal word lines on which the repair target cells are positioned may be replaced with redundancy word lines of redundancy cells. In other words, redundant paths between the repair target cells and the redundancy cells may be formed.

The repair fuse block 140 may include a plurality of fuse sets (not shown) for programming addresses of the repair target cells, that is, repair target addresses. The repair fuse block 140 may output the repair target addresses programmed in the plurality of fuse sets, to the fuse information storage block 150, in response to the boot-up signal BOOTUP.

The fuse information storage block 150 may store the repair target addresses provided from the repair fuse block 140 as repair information INF_R, and may output the stored repair information INF_R to the repair control block 160, in response to the word line active command RACT, the boot-up signal BOOTUP and the target row address ATROW<0:12>. In an embodiment of the present disclosure, the fuse information storage block 150 may be configured by a plurality of memory cells including cell capacitors which have the same configuration as cell capacitors of the normal and the redundancy cells of the memory array region 170. The fuse information storage block 150 may store the repair target address provided from the repair fuse block 140, in a memory cell corresponding to the target row address ATROW<0:12>, as the repair information INF_R, in response to the boot-up signal BOOTUP, and may output the repair information INF_R stored in the memory cell corresponding to the target row address ATROW<0:12> in response to the word line active command RACT. In particular, the fuse information storage block 150 may sequentially refresh memory cells corresponding to the target row address ATROW<0:12> in response to the word line active command RACT in such a manner that the memory cells are refreshed simultaneously with the normal and the redundancy cells of the memory array region 170, whereby it is possible to ensure reliability of the stored repair information, The repair control block 160 may compare the repair information INF_R provided from the fuse information storage block 150 and the target row address ATROW<0:12> outputted from the operation control block 130. If the repair information INF_R and the target row address ATROW<0:12> correspond to each other, the repair control block 160 may output a repair control signal HITSUM.

The row circuit 180 may activate a word line selected by the target row address ATROW<0:12> in response to the word line active command RACT, and activate a redundancy word line instead of the word line designated by the target row address ATROW<0:12> in the case where the repair control signal HITSUM is received. The repair target word line corresponding to the repair information INF_R stored in the fuse information storage block 150 may be replaced with the redundancy word line. In the refresh mode, the row circuit 180 may receive the target row address ATROW<0:12> in response to the word line active command RACT, sequentially access all word lines in the memory array region 170, and perform a refresh operation. The memory cells of the fuse information storage block 150 and the memory cells of the memory array region 170 may be refreshed by the same target row address ATROW<0:12>, simultaneously.

The sense amplifier block 192 may perform an operation of sensing and amplifying data of a memory cell transmitted through a bit line from the memory array region 170, in response to the sense amplifier control signal SAEN.

The column circuit 194 may access data of a bit line selected by the column address C_ADD. For example, in a read operation, the column circuit 194 may output data transferred from a bit line selected by the column address C_ADD to a DQ pad in response to the read command RD. Also, in a write operation, the column circuit 194 may transfer data inputted through a DQ pad, to a bit line corresponding to the column address C_ADD, in response to the write command WT, and thereby may store the data.

Meanwhile, in the conventional art, a repair fuse block, generally uses laser fuses. Each laser fuse stores a high or low logic data according to whether it is cut or not. Laser fuses may be programmed at a wafer level, however, may not be programmed after a wafer is mounted in a package (i.e., package level). Also, it is difficult to design a laser fuse to have a small circuit area, due to a limit in pitch. In order to overcome such disadvantages, the repair fuse block 140 may be configured by one of nonvolatile memories such as an array e-fuse (ARE) circuit, a NAND flash memory, a NOR flash memory, an MRAM (magnetic random access memory), an STT-MRAM (spin torque transfer magnetic random access memory), an ReRAM (resistive random access memory) and a PC RAM (phase change random access memory).

In the semiconductor memory device in accordance with an embodiment of the present disclosure, the fuse information storage block 150 which stores fuse information may be formed to have not a conventional latch structure but a memory cell structure. Moreover, the memory cells of the fuse information storage block 150 and the normal cells and the redundancy cells disposed in the memory array region 170 may be refreshed by the same row addresses. As a consequence, it may be possible to ensure improved reliability of the repair information stored in the fuse information storage block 150. Further, in a semiconductor memory device according to an embodiment of the invention, since the fuse information storage block 150 may be realized by cell capacitors included in the memory array region 170, it may be possible to decrease a circuit area even with an increasing amount of repair data.

Figure 3:
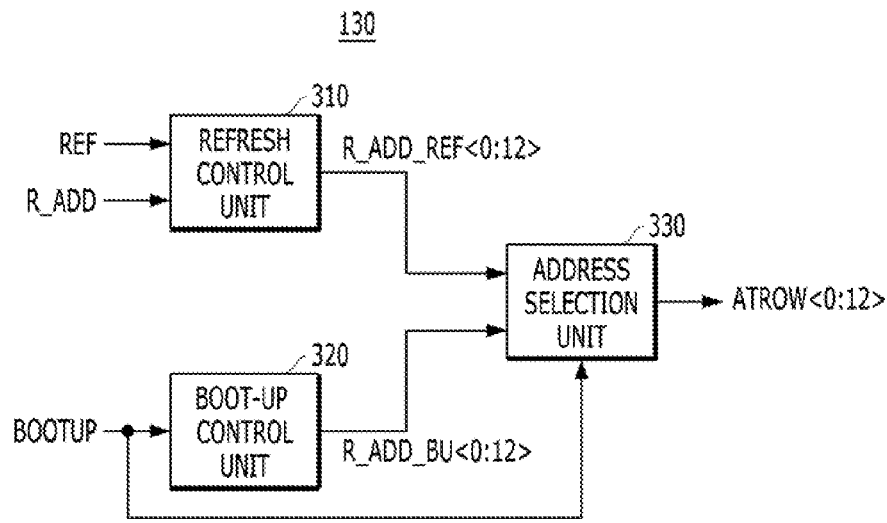
FIG. 3 is a detailed diagram of an example of an operation control block shown in FIG. 2.

FIG. 3 is a detailed diagram of the operation control block 130 shown in FIG. 2.

Referring to FIG. 3, the operation control block 130 may include a refresh control unit 310, a boot-up control unit 320, and an address selection unit 330.

The refresh control unit 310 may output one of a refresh address REF_ADD generated by counting the refresh signal REF and the row address R_ADD as a selected address R_ADD_REF<0:12>. The boot-up control unit 320 may perform a counting operation based on the boot-up signal BOOTUP to generate a boot-up address R_ADD_BU<0:12>. The address selection unit 330 selectively may output one of the selected address R_ADD_REF<0:12> and the boot-up address R_ADD_BU<0:12> as the target row address ATROW<0:12>, in response to the boot-up signal BOOTUP.

Figure 4:
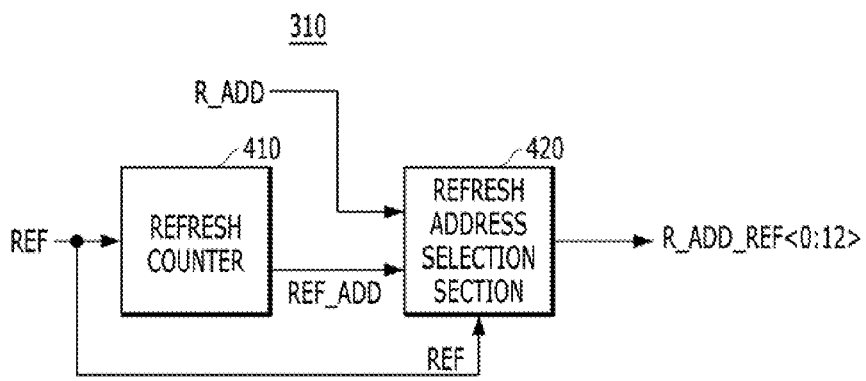
FIG. 4 is a detailed diagram of an example of a refresh control unit shown in FIG. 3.

FIG. 4 is a detailed diagram of the refresh control unit 310 shown in FIG. 3.

Referring to FIG. 4, the refresh control unit 310 may include a refresh counter 410 and a refresh address selection section 420.

The refresh counter 410 may count the refresh signal REF which toggles with a predetermined cycle to generate the refresh address REF_ADD. The refresh address selection section 420 may output one of the refresh address REF_ADD and the row address R_ADD received from the address buffer 120 as the selected address R_ADD_REF<0:12>. The refresh address selection section 420 may output the refresh address REF_ADD in the refresh mode, and may output the row address R_ADD in the normal mode, FIG. 5 is a detailed diagram of the boot-up control unit 320 shown in FIG. 3.

Figure 5:
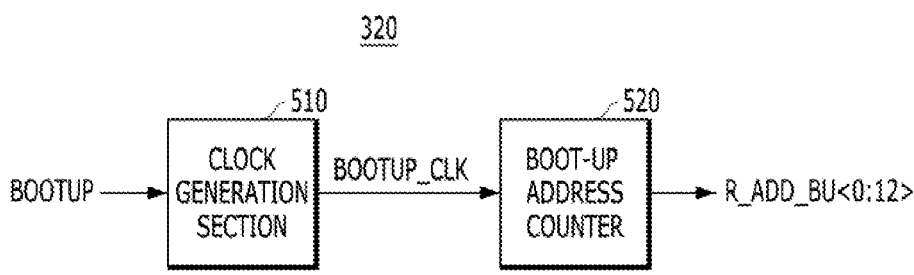
FIG. 5 is a detailed diagram of an example of a boot-up control unit shown in FIG. 3.

Referring to FIG. 5, the boot-up control unit 320 may include a dock generation section 510 and a boot-up address counter 520.

The dock generation section 510 may receive the boot-up signal BOOTUP to generate a boot-up clock BOOTUP_CLK. The boot-up address counter 520 may count the boot-up clock BOOTUP_CLK to generate the boot-up address R_ADD_BU<0:12>.

Since the detailed structures of the clock generation section 510 and the boot-up address counter 520 are well-known in the art, detailed descriptions thereof will be omitted herein.

Figure 6:
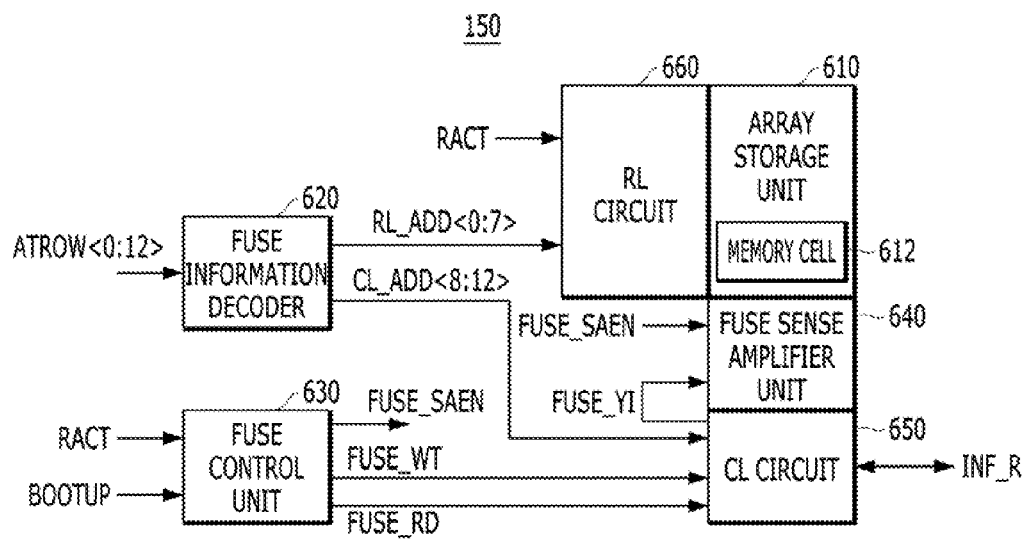
FIG. 6 is a detailed diagram of an example of a fuse information storage block shown in FIG. 2.

FIG. 6 is a detailed diagram of the fuse information storage block 150 shown in FIG. 2.

Referring to FIG. 6, the fuse information storage block 150 may include an array storage unit 610, a fuse information decoder 620, a fuse control unit 630 a fuse sense amplifier unit 640, column line (CL) circuit 650, and a row line (RL) circuit 660.

The array storage unit 610 may include a plurality of memory cells 612 coupled by row lines and column lines.

Figure 7:
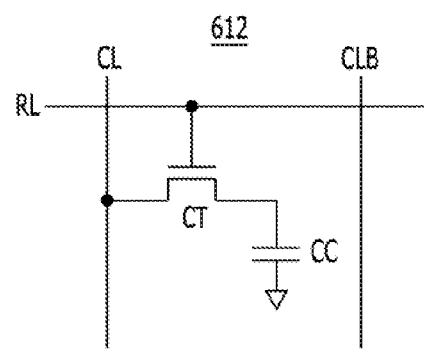
FIG. 7 is a detailed diagram of an example of a memory cell included in an array storage unit shown in FIG. 6.

FIG. 7 is a detailed diagram of a memory cell 612 included in the array storage unit 610 shown in FIG. 6.

Referring to FIG. 7, each of the plurality of memory cells 612 may include a cell transistor CT coupled with a column line CL at one end thereof. The transistor may receive data of a row line RL through its gate Each memory cell 612 may also have a cell capacitor CC coupled between the other end of the cell transistor CT and a ground voltage terminal. The cell capacitor CC may have the same configuration as the cell capacitors of the normal and the redundancy cells of the memory array region 170.

The fuse information decoder 620 may decode the target row address ATROW<0:12> to generate a column line address CL_ADD<8:12> and a row line address RL_ADD<0:7>.

The fuse control unit 630 may generate a fuse sense amplifier, enable signal FUSE_SAEN, a fuse write signal FUSE_WT and a fuse read signal FUSE_RD in response to the word line active command RACT and the boot-up signal BOOTUP. The fuse write signal FUSE_WT may control the performance of a write operation of the CL circuit 650, that is, an operation for storing the repair target addresses programmed in the repair fuse block 140 as the repair information INF_R, in the boot-up mode. The fuse read signal FUSE_RD may control the performance of a read operation of the CL circuit 650, that is, an operation for outputting the stored repair information INF_R in the normal mode. The fuse sense amplifier enable signal FUSE_SAEN may be activated when the fuse write signal FUSE_WT or the fuse read signal FUSE_RD is activated to control the fuse sense amplifier unit 640 of the fuse information storage block 150.

The fuse sense amplifier unit 640 may sense and amplify data of a pair of column lines CL and CLB of the array storage unit 610 in response to the fuse sense amplifier enable signal FUSE_SAEN, and may input and output data of the pair of column lines CL and CLB in response to a fuse column select signal FUSE_YI.

The CL circuit 650 may output the data of the pair of column lines CL and CLB as the repair information INF_R, in response to the fuse read signal FUSE_RD, and may store the repair information INF_R in the pair of column lines CL and CLB in response to the fuse write signal FUSE_WT. Further, the CL circuit 650 may decode the column line address CL_ADD<8:12> to generate the fuse column select signal FUSE_YI.

The RL circuit 660 may activate a row line of the array storage unit 610 in response to the word line active command RACT and the row line address RL_ADD<0:7>.

Figure 8A:
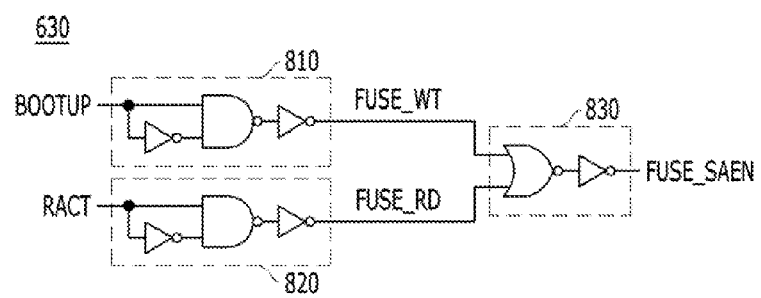
FIG. 8A is a detailed diagram of an example of a fuse control unit shown in FIG. 6.
Figure 8B:
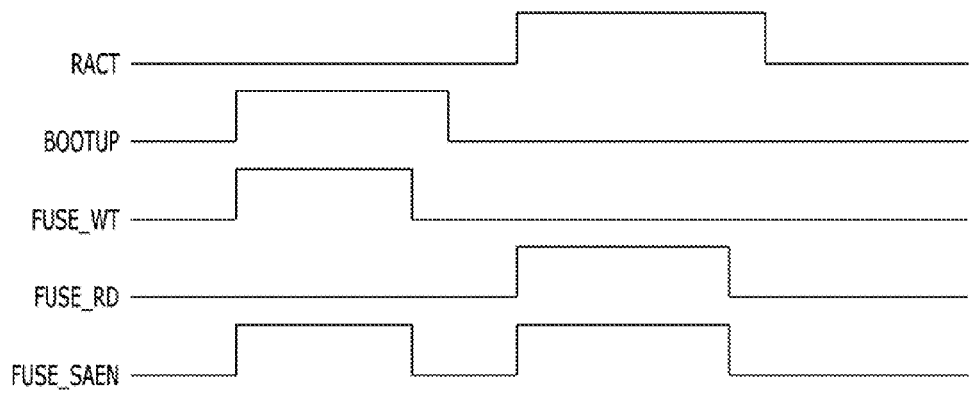
FIG. 8B is a timing diagram for describing an operation of the fuse control unit shown in FIG. 8A.

FIG. 8A is a detailed diagram of the fuse control unit 630 shown in FIG. 6. FIG. 8B is a timing diagram for describing an operation of the fuse control unit 630 shown in FIG. 8A.

Referring to FIGS. 8A and 8B, the fuse control unit 630 may include a write signal generation section 810, a read signal generation section 820, and an enable signal generation section 830.

The write signal generation section 810 may receive the boot-up signal BOOTUP to generate the fuse write signal FUSE_WT. The fuse write signal FUSE_WT may be activated during an initial period of the activation period of the boot-up signal BOOTUP. The read signal generation section 820 may receive the word line active command RACT to generate the fuse read signal FUSE_RD. The fuse read signal FUSE_RD may be activated during an initial period of the activation period of the word line active command RACT. The enable signal generation section 830 may generate the fuse sense amplifier enable signal FUSE_SAEN which is activated when the fuse write signal FUSE_WT or the fuse read signal FUSE_RD is activated.

Figure 9A:
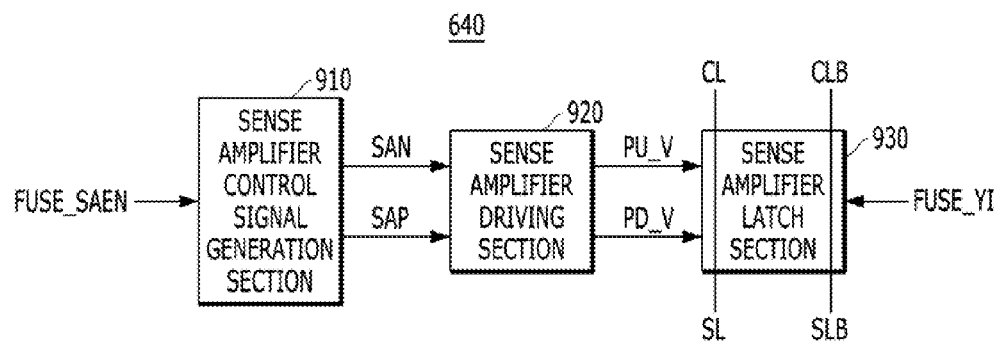
FIG. 9A is a detailed diagram of an example of a fuse sense amplifier unit shown in FIG. 6.
Figure 9B:
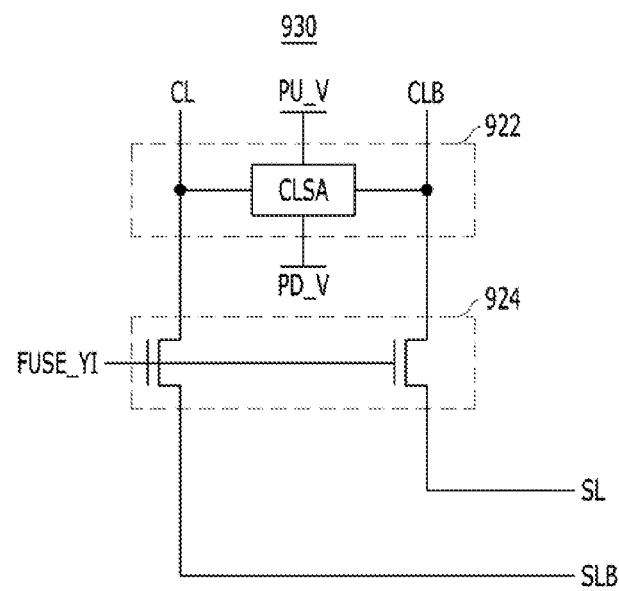
FIG. 9B is a circuit diagram of an example of a sense amplifier latch section shown in FIG. 9A.

FIG. 9A is a detailed diagram of the fuse sense amplifier unit 640 shown in FIG. 6. FIG. 9B is a detailed diagram of the sense amplifier latch section 930 shown in FIG. 9A.

Referring to FIG, 9A, the fuse sense amplifier unit 640 may include a sense amplifier control signal generation section 910, a sense amplifier driving section 920, and a sense amplifier latch section 930.

The sense amplifier control signal generation section 910 may generate sense amplifier control signals SAP and SAN in response to the fuse sense amplifier enable signal FUSE_SAEN. The sense amplifier control signals SAP and SAN may include a pull-up power driving signal SAP and a pull-down power driving signal SAN each of which is activated for a predetermined period., The sense amplifier driving section 920 may provide driving voltages through a pull-up power line PU_V and a pull-down power line PD_V in response to the sense amplifier control signals SAP and SAN.

The sense amplifier latch section 930 may sense and amplify the data of the pair of column lines CL and CLB by using the driving voltages supplied through the pull-up power line PU_V and the pull-down power line PD_V. Also, the sense amplifier latch section 930 may output the sensed and amplified data of the pair of column lines CL and CLB to a pair of segment lines SL and SLB or input the data of the pair of segment lines SL and SLB to the pair of column lines CL and CLB, in response to the fuse column select signal FUSE_YI. To this end, referring to FIG. 9B, the sense amplifier latch section 930 may include a column line sense amplifier 922 and a data input/output part 924. The column line sense amplifier 922 may sense and amplify the data of the pair of column lines CL and CLB by using the driving voltages supplied through the pull-up power line PU_V and the pull-down power line PD_V. The data input/output part 924 may couple the pair of column lines CL and CLB and the pair of segment lines SL and SLB in response to the fuse column select signal FUSE_YI.

The fuse sense amplifier unit 640 may have a configuration similar to the sense amplifier block 192 for sensing and amplifying the data of a pair of bit lines BL and BLB of the memory array region 170. Further, in order to improve an initial sensing strength, the fuse sense amplifier unit 640 may additionally have configurations for an overdriving scheme.

Figure 10:
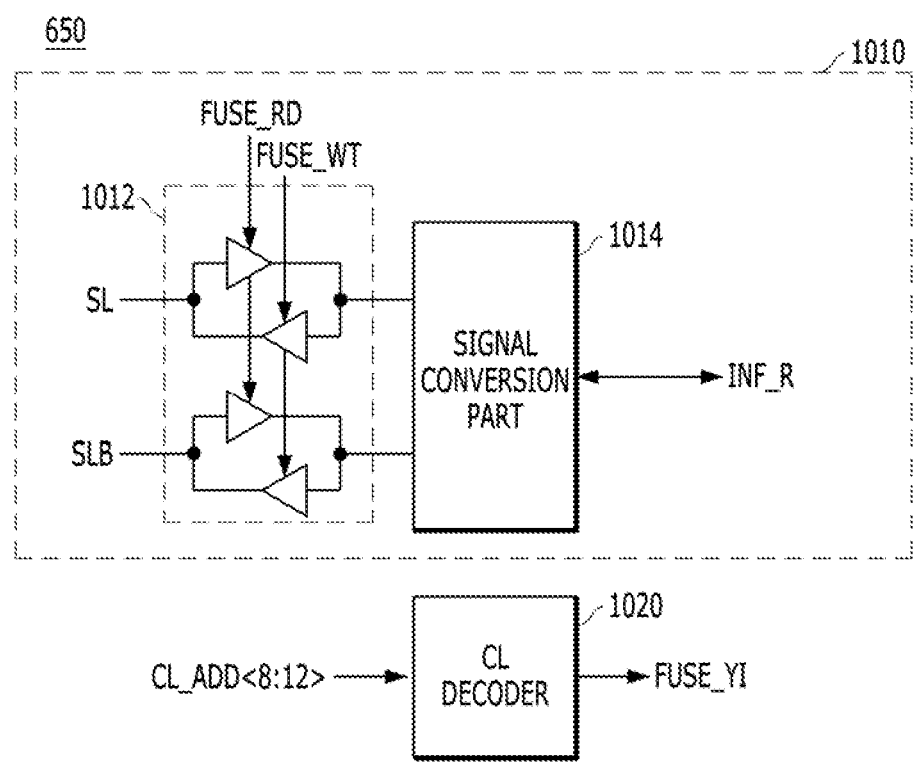
FIG. 10 is a detailed diagram of an example of a column line (CL) circuit shown in FIG. 6.

FIG. 10 is a detailed diagram of the CL circuit 650 shown in FIG. 6.

Referring to FIG. 10, the CL circuit 650 may include a column line (CL) driver 1010 and a column line (CL) decoder 1020.

The CL driver 1010 may output the data transferred to the pair of segment lines SL and SLB as the repair information INF_R, in response to the fuse read signal FUSE_RD and transfer the repair information INF_R to the pair of segment lines SL and SLB in response to the fuse write signal FUSE_WT. The CL driver 1010 may include an input/output driver 1012 and a signal conversion part 1014. The input/output driver 1012 may output the data transferred to the pair of segment lines SL and SLB, in response to the fuse read signal FUSE_RD, and receive the repair information INF_R in response to the fuse write signal FUSE_WT. The signal conversion part 1014 may convert data differentially inputted through the input/output driver 1012, into the repair information INF_R as a single signal and convert the repair information INF_R as a single signal into differential data.

The CL decoder 1020 may decode the column line address CL_ADD<8:12> to generate the fuse column select signal FUSE_YI.

As is apparent from the above descriptions, according to the embodiment, since a fuse information storage block which stores fuse Information for a repair operation is realized by cell capacitors included in a memory array, it is possible to decrease a circuit area even with an increasing amount of repair data. Also, in the semiconductor memory device, since cell capacitors in the memory array and cell capacitors in the fuse information storage block may be refreshed simultaneously, improved reliability of repair information stored in the fuse information storage block may be ensured.

Although various embodiments have been described for illustrative purposes, it will be apparent to those skilled in the art that various changes and modifications may be made without departing from the spirit and scope of the invention as defined in the following

What is claimed is:

1. A semiconductor memory device comprising:
   a memory array region including normal cells and redundancy cells;
   a repair fuse block including a plurality of fuse sets suitable for programming repair addresses of the repair target cells as repair information, the repair fuse block being suitable for outputting the programmed repair information, in response to a boot-up signal;
   a fuse information storage block including a plurality of memory cells for storing the repair information outputted from the repair fuse block, the plurality of memory cells being refreshed simultaneously with the normal cells and the redundancy cells of the memory array region; and
   a repair control block suitable for comparing the repair information stored in the fuse information storage block and an address to generate a repair control signal to selectively activate redundant paths between the repair target cells and the redundancy cells.

2. The semiconductor memory device according to claim 1, wherein each of the plurality of memory cells of the fuse information storage block comprises:
   a cell transistor coupled with a column line at one end thereof, and inputted with data of a row line through a gate thereof; and
   a cell capacitor coupled between the other end of the cell transistor and a ground voltage terminal.

3. The semiconductor memory device according to claim 2, wherein the cell capacitor has the same configuration as cell capacitors which are included in the normal cells and the redundancy cells of the memory array region.

4. The semiconductor memory device according to claim 1, wherein the fuse information storage block stores the repair information outputted from the repair fuse block, in the plurality of memory cells, in response to the boot-up signal, and outputs the repair information stored in the plurality of memory cells, in response to a word line active command.

5. The semiconductor memory device according to claim 1, wherein the repair fuse block comprises an array e-fuse (ARE) or a nonvolatile memory device.

6. A semiconductor memory device comprising:
   a memory array region including normal cells and redundancy cells;
   a repair fuse block including a plurality of fuse sets suitable for programming repair addresses of the repair target cells as repair information, the repair fuse block being suitable for outputting the repair information programmed in the plurality of fuse sets, in response to a boot-up signal;
   an operation control block suitable for selectively outputting one among a refresh address generated by counting a refresh signal, a row address and a boot-up address generated by performing a counting operation based on the boot-up signal, as a target row address;
   a fuse information storage block suitable for storing the repair information outputted from the repair fuse block and outputting the stored repair information, in response to a word line active command, the boot-up signal and the target row address, and including a plurality of memory cells which are refreshed;
   a repair control block suitable for comparing the repair information stored in the fuse information storage block and the target row address to generate a repair control signal to selectively activate redundant paths between the repair target cells and the redundancy cells;
   a row circuit suitable for activating a word line selected by the target row address, and selectively activating the redundant paths in response to the repair control signal; and
   a column circuit suitable for accessing data of a bit line selected by a column address in a read or write operation.

7. The semiconductor memory device according to claim 6, wherein the normal cells and the redundancy cells of the memory array region and the memory cells of the fuse information storage block are simultaneously refreshed in response to the target row address.

8. The semiconductor memory device according to claim 6, wherein the fuse information storage block stores the repair information in a memory cell corresponding to the target row address, in response to the boot-up signal, and outputs the stored repair information from the memory cell corresponding to the target row address, in response to the word line active command.

9. The semiconductor memory device according to claim 6, further comprising:
   a sense amplifier block suitable for sensing and amplifying data of a memory cell transmitted through the bit line from the memory array region, in response to a sense amplifier control signal.

10. The semiconductor memory device according to claim 6, wherein the operation control block comprises:
   a refresh control unit suitable for generating the refresh address by counting the refresh signal, and outputting one of the refresh address and the row address as a selected address;
   a boot-up control unit suitable for generating the boot-up address by performing a counting operation based on the boot-up signal; and
   an address selection unit suitable for selecting one of the selected address and the boot-up address, to output the target row address, in response to the boot-up signal.

11. The semiconductor memory device according to claim 10, wherein the refresh control unit comprises:
   a refresh counter suitable for generating the refresh address by counting the refresh signal; and
   a refresh address selection section suitable for outputting one of the refresh address and the row address as the selected address, in response to the refresh signal.

12. The semiconductor memory device according to claim 10, wherein the boot-up control unit comprises:
   a clock generation section suitable for receiving the boot-up signal to generate a boot-up dock; and
   a boot-up address counter suitable for generating the boot-up address by counting the boot-up clock.

13. The semiconductor memory device according to claim 6, wherein the fuse information storage block comprises:
   an array storage unit including the plurality of memory cells which are coupled by row lines and column lines;
   a fuse information decoder suitable for decoding the target row address to generate a column line address and a row line address;
   a fuse control unit suitable for generating a fuse sense amplifier enable signal, a fuse write signal and a fuse read signal in response to the word line active command and the boot-up signal;
   a fuse sense amplifier unit suitable for sensing and amplifying data of column lines of the array storage unit in response to the fuse sense amplifier enable signal, and inputting/outputting sensed and amplified data in response to a fuse column select signal;
   a column line circuit suitable for outputting the data of the column lines as the repair information in response to the fuse read signal, storing the repair information as data of the column lines in response to the fuse write signal, and generating the fuse column select signal by decoding the column line address; and
   a row line circuit suitable for activating a row line of the array storage unit in response to the word line active command and the row line address.

14. The semiconductor memory device according to claim 13, wherein each of the plurality of memory cells of the fuse information storage block comprises:
   a cell transistor coupled with a column line at one end thereof, and inputted with data of a row line through a gate, thereof; and
   a cell capacitor coupled between the other end of the cell transistor and a ground voltage terminal.

15. The semiconductor memory device according to claim 14, wherein the cell capacitor has the same configuration as cell capacitors of the normal cells and the redundancy cells of the memory array region.

16. The semiconductor memory device according to claim 13, wherein the fuse control unit comprises:
   a write signal generation section suitable for receiving the boot-up signal to generate the fuse write signal activated during an initial period of an enable period of the boot-up signal;

a read signal generation section suitable for receiving the word line active command to generate the fuse read signal activated during an initial period of an enable period of the word line active command; and an enable signal generation section suitable for generating the fuse sense amplifier enable signal activated when the fuse write signal or the fuse read signal is activated.

17. The semiconductor memory device according to claim 13, wherein the fuse sense amplifier unit comprises:

a sense amplifier control signal generation section suitable for generating sense amplifier control signals in response to the fuse sense amplifier enable signal;

a sense amplifier driving section suitable for providing driving voltages through a pull-up power line and a pull-down power line in response to the sense amplifier control signals; and a sense amplifier latch section suitable for sensing and amplifying data of column lines by using the driving voltages supplied through the pull-up power line and the pull-down power line, and inputting and outputting data of the column lines in response to the fuse column select signal.

18. The semiconductor memory device according to claim 13, wherein the column line circuit comprises:

a column line driver suitable for outputting the data of the column lines as the repair information in response to the fuse read signal, and storing the repair information as data of the column lines in response to the fuse write signal; and a column line decoder suitable for decoding the column line address to generate the fuse column select signal.

19. The semiconductor memory device according to claim 6, wherein the repair fuse block comprises an array e-fuse (ARE) or a nonvolatile memory device.

* * * * *